(12) United States Patent
Deguchi et al.

(10) Patent No.: US 8,040,187 B2
(45) Date of Patent: Oct. 18, 2011

(54) SEMICONDUCTOR INTEGRATED CIRCUIT DEVICE

(75) Inventors: Jun Deguchi, Kanagawa (JP); Naoki Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 12/556,115

(22) Filed: Sep. 9, 2009

(65) Prior Publication Data

US 2010/0244964 A1      Sep. 30, 2010

(30) Foreign Application Priority Data

Mar. 31, 2009   (JP) .................................. 2009-086572

(51) Int. Cl.
*H03F 3/04*         (2006.01)

(52) U.S. Cl. ...................................................... 330/296

(58) Field of Classification Search .......... 330/295–296, 330/253, 277
See application file for complete search history.

(56) References Cited

U.S. PATENT DOCUMENTS 7,358,810 B2 * 4/2008 Kwon et al. .................. 330/253

FOREIGN PATENT DOCUMENTS

| JP | 2001-094362 | 4/2001 |
|---|---|---|
| JP | 2001-185964 | 7/2001 |
| JP | 2006-60606 | 3/2006 |
| JP | 2006-157644 | 6/2006 |
| JP | 2006-211550 | 8/2006 |

OTHER PUBLICATIONS

Office Action issued Jun. 28, 2011, in Japanese Patent Application No. 2009-086572 (with English-language Translation).

* cited by examiner

*Primary Examiner* — Robert Pascal
*Assistant Examiner* — Khiem Nguyen
(74) *Attorney, Agent, or Firm* — Oblon, Spivak, McClelland, Maier & Neustadt, L.L.P.

(57) ABSTRACT

A semiconductor integrated circuit device constituting an inverting amplifier employs a cascode current source as a current source. In the semiconductor integrated circuit device, a high-potential-side transistor of the cascode current source and a low-potential-side transistor constituting an amplification portion are shared. The configuration can not only make an output impedance of the cascode current source high and improve current source characteristics but also make a minimum potential at a minimum potential point of the amplification portion low and ensure a sufficient power supply voltage margin.

16 Claims, 5 Drawing Sheets

SEMICONDUCTOR INTEGRATED CIRCUIT DEVICE

CROSS-REFERENCE TO RELATED APPLICATION

This application is based upon and claims the benefit of priority from the prior Japanese Patent Application No. 2009-86572 filed in Japan on Mar. 31, 2009; the entire contents of which are incorporated herein by reference.

BACKGROUND OF THE INVENTION

1. Field of the Invention

The present invention relates to a semiconductor integrated circuit device suitable for an inverting amplifier.

2. Description of Related Art

An inverting amplifier is often used in a conventional analog circuit. For example, in a radio transceiver, inverting amplifiers are used in circuit blocks such as a local oscillation buffer circuit and a current-voltage conversion circuit, and frequency of use of inverting amplifiers is high.

As an example of such an inverting amplifier, a CMOS inverting amplifier configured to perform stable amplification at low voltage is disclosed in Japanese Patent Application Laid-Open Publication No. 2006-60606 (hereinafter referred to as Document 1). The inverting amplifier in Document 1 is a single-phase amplifier circuit. For the reason, the invention of Document 1 is disadvantageous, e.g., in that the inverting amplifier is susceptible to common mode noise, and output amplitude may become small or oscillation may occur due to in-phase components.

Accordingly, a differential amplifier circuit using a current source may be adopted as an inverting amplifier. In such an inverting amplifier, a common source of a pair of transistors with a differential configuration is connected to a current source, and a bias current is supplied by the current source.

An ideal current source as such a current source configured to supply a bias current is a current source whose output impedance is infinite and which is capable of supplying a constant current regardless of an output voltage. An actual current source is composed of, e.g., a transistor and uses, as a bias current, a drain current obtained by controlling a gate voltage. However, in a transistor, an output impedance decreases, and a drain current increases with a rise in output voltage, due to channel length modulation effect caused by miniaturization. A transistor thus cannot constitute an ideal current source.

BRIEF SUMMARY OF THE INVENTION

A semiconductor integrated circuit device according to an aspect of the present invention includes an amplification portion having a first transistor configured to inversely amplify an input signal inputted to a gate and output the inversely amplified input signal from a drain, a cascode current source composed of the first transistor, a second transistor having a drain connected to a source of the first transistor and a source connected to a reference potential point to supply a bias current to the first transistor, a third transistor having a gate connected to the gate of the first transistor in a DC manner, a fourth transistor having a gate connected to a gate of the second transistor, and a current source, and configured to control the bias current based on a current flowing into the current source, and a resistive element configured to disconnect the drain of the first transistor and the gates of the first and third transistors in an AC manner and connect the drain of the first transistor and the gates of the first and third transistors in a DC manner.

A semiconductor integrated circuit device according to another aspect of the present invention includes an amplification portion having a first transistor configured to inversely amplify an input signal inputted to a gate and output the inversely amplified input signal from a drain, a second transistor having a drain connected to a source of the first transistor and a source connected to a reference potential point to supply a bias current to the first transistor, and a cascode current source composed of a fifth transistor and a sixth transistor which have same characteristics as the first and second transistors, respectively, a seventh transistor having a gate connected to a gate of the fifth transistor, an eighth transistor having a gate connected to a gate of the sixth transistor, and a current source, and configured to control the bias current based on a current flowing into the current source.

DETAILED DESCRIPTION OF THE INVENTION

Embodiments of the present invention will be described below in detail with reference to the drawings.

First Embodiment

Figure 1:
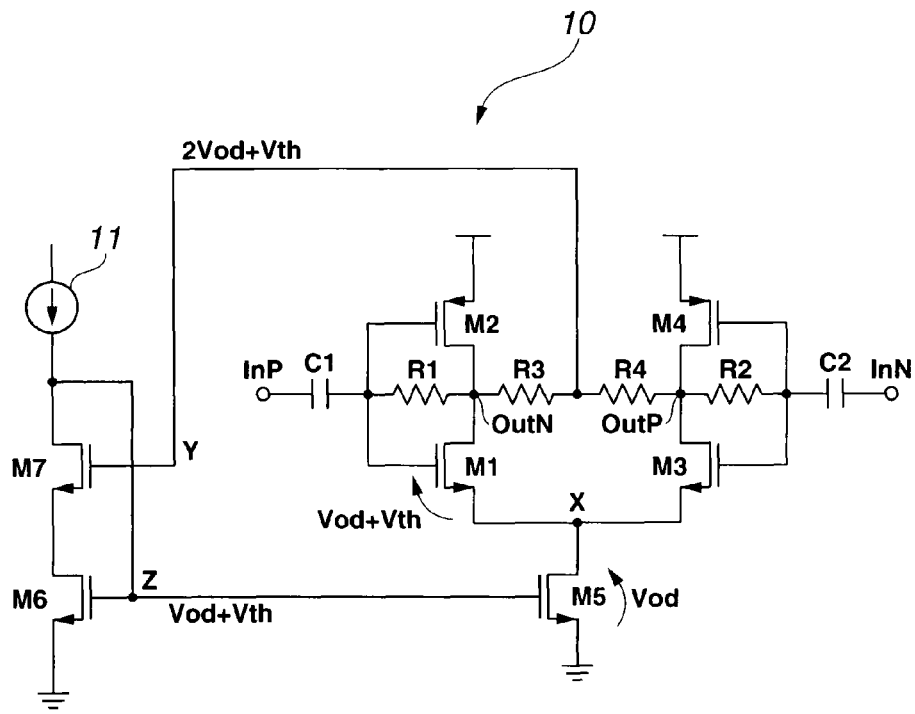
FIG. 1 is a circuit diagram showing a semiconductor integrated circuit device according to a first embodiment of the present invention.

FIG. 1 is a circuit diagram showing a semiconductor integrated circuit according to a first embodiment of the present invention.

The semiconductor integrated circuit in FIG. 1 constitutes an inverting amplifier. Use of a cascode current source as a current source of an inverting amplifier or the like for an improvement in characteristics is contemplated. A cascode current source can be composed of two transistors cascoded between a reference potential point and a common source of a pair of transistors with a differential configuration constituting an inverting amplifier. A current source with the configuration is higher in output impedance than a current source using one transistor by a magnitude corresponding to an additional cascoded transistor. A cascode current source thus has an advantage of having improved current source characteristics.

Design of a DC characteristic of an inverting amplifier requires consideration of a minimum acceptable voltage (overdrive voltage). An overdrive voltage is represented by a difference between a gate-to-source voltage of Vgs and a threshold voltage of Vth for turning on a transistor and is an indication of how much the gate-to-source voltage of Vgs for turning on a transistor is higher than the threshold voltage of Vth. In order to cause a transistor to perform in saturated region, a drain-to-source voltage of Vds needs to be higher than an overdrive voltage of Vod.

In the case of a current source using one transistor, it is necessary to apply at least a voltage of Vod to a drain of the transistor with respect to a source. In contrast, in a cascode current source, at least a voltage of 2Vod needs to be applied to a drain of a cascoded transistor with respect to a source of a transistor connected to a reference potential point. That is, a minimum voltage to be applied to a common source of a pair of transistors with a differential configuration rises from Vod to 2Vod.

For the reason, a power supply voltage margin which affects an input-output voltage range becomes remarkably low in a cascode current source. Along with development of CMOS process technology, a power supply voltage has recently been decreasing, and a power supply voltage margin has a significant effect. Additionally, in a cascode current source, a bias circuit for applying a bias voltage to a cascoded transistor needs to be separately prepared, and a circuit area and power consumption increase.

Before an inverting amplifier 10 in FIG. 1 is described, a general inverting amplifier 20 shown in FIG. 2 will be described first.

Figure 2:
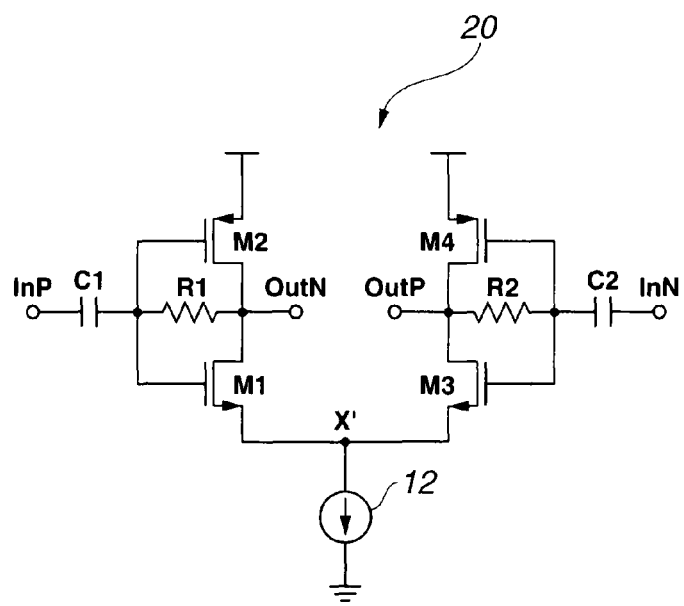
FIG. 2 is a circuit diagram showing a general inverting amplifier.

In FIG. 2, a positive-phase input signal is inputted to an input terminal InP while a negative-phase input signal is inputted to an input terminal InN. The positive-phase input signal inputted to the input terminal InP is supplied to a gate of an NMOS transistor M1 and a gate of a PMOS transistor M2 via a capacitor C1. The negative-phase input signal inputted to the input terminal InN is supplied to a gate of an NMOS transistor M3 and a gate of a PMOS transistor M4 via a capacitor C2.

Drains of the transistors M1 and M2 configured to perform inverse amplification are commonly connected. A source of the transistor M2 is connected to a power supply terminal while a source of the transistor M1 is connected to a reference potential point via a current source 12. Drains of the transistors M3 and M4 configured to perform inverse amplification are commonly connected. A source of the transistor M4 is connected to a power supply terminal while a source of the transistor M3 is connected to the reference potential point via the current source 12. The transistors M1 and M2 and the transistors M3 and M4 constitute an inverting differential amplifier circuit.

A resistor R1 is connected between a common gate and a common drain of the transistors M1 and M2, and the common drain is connected to an output terminal OutN. A resistor R2 is connected between a common gate and a common drain of the transistors M3 and M4, and the common drain is connected to an output terminal OutP. The positive-phase and negative-phase input signals are amplified, the positive-phase input signal is outputted from the output terminal OutP, and the negative-phase input signal is outputted from the output terminal OutN.

Figure 3:
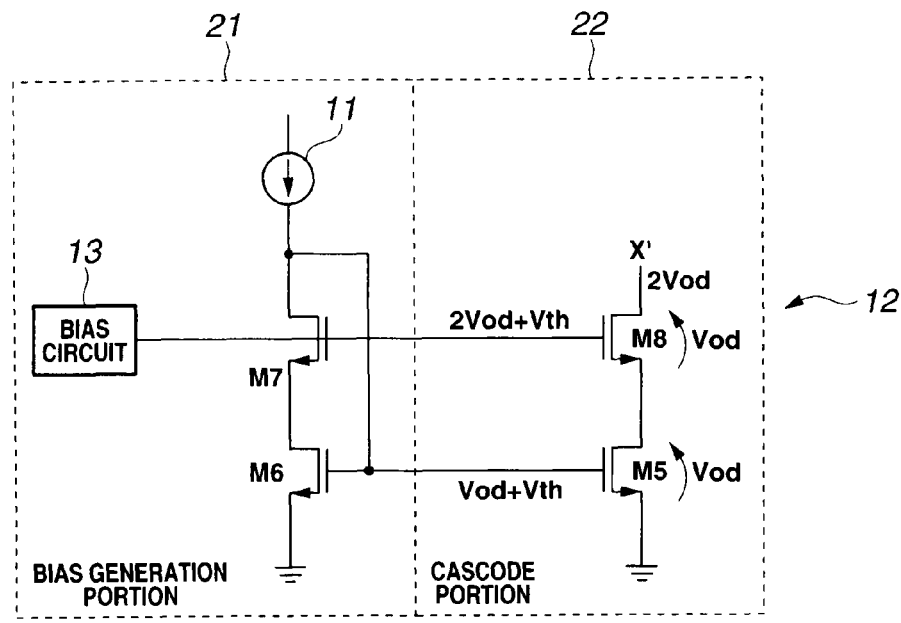
FIG. 3 is a circuit diagram showing circuitry when a cascode current source with a high output impedance is adopted as a current source 12.

FIG. 3 is a circuit diagram showing circuitry when a cascode current source with a high output impedance is adopted as the current source 12. FIG. 3 shows only a bias generation portion 21 and a cascode portion 22 constituting the cascode current source.

The cascode portion 22 is composed of cascoded transistors M5 and M8. A drain of the transistor M8 is connected to a common source (point X') (FIG. 2) of the pair of transistors M1 and M3 constituting a differential pair, and a source is connected to a drain of the transistor M5. A source of the transistor M5 is connected to a reference potential point.

A gate of the transistor M5 is commonly connected to a gate of a transistor M6 constituting the bias generation portion 21. The bias generation portion 21 is composed of a current source 11, a bias circuit 13, and the transistor M6 and a transistor M7. The transistor M7 has a drain connected to the current source 11 and a source connected to a drain of the transistor M6. A source of the transistor M6 is connected to a reference potential point.

Upon application of a same gate voltage to the gates of the transistors M5 and M6, a mirror current based of a current flowing into the current source 11 flows into the transistor M5. The transistor M8 cascoded to the transistor M5 is inserted in order to increase an output impedance of the cascode portion 22.

However, as described above, a drain-to-source voltage of each of the transistors M5 and M8 needs to be equal to or more than an overdrive voltage of Vod, and it is necessary to set a voltage at the point X' to 2Vod or more in the circuit in FIG. 3. Accordingly, if a cascode current source with a high output impedance is adopted in the inverting amplifier 20 in FIG. 2, a power supply voltage margin becomes low. The transistor M5 in FIG. 3 is biased by the current from the current source 11 and is driven. In order to drive the transistor M8, the bias circuit 13 configured to supply a voltage of 2Vod+Vth or more to a gate is separately required.

The inverting amplifier 10 according to the present embodiment has a differential configuration composed of the transistors M1 and M2 and the transistors M3 and M4 configured to perform inverse amplification, as shown in FIG. 1. A positive-phase input signal is inputted to the input terminal InP while a negative-phase input signal is inputted to the input terminal InN. The input terminal InP is connected to gates of the transistors M1 and M2 via the capacitor C1. The input terminal InN is connected to gates of the transistors M3 and M4 via the capacitor C2. The capacitors C1 and C2 each function as a filter configured to block a DC component.

The resistor R1 is connected between a common gate and a common drain of the transistors M1 and M2, and the resistor R2 is connected between a common gate and a common drain of the transistors M3 and M4. The common drain of the transistors M1 and M2 functions as the output terminal OutN. The common drain of the transistors M3 and M4 also functions as the output terminal OutP. Resistors R3 and R4 are series-connected between the common drain of the transistors M1 and M2 and the common drain of the transistors M3 and M4.

A parasitic capacitance (not shown) is connected to each of the resistors R1 to R4, and the resistors R1 to R4 each function as a filter configured to block an AC component. The resistors R1 to R4 are provided on a path through which direct current does not flow and can transfer a DC component without attenuation of a DC component.

Note that although the resistors R1 to R4 are used in the present embodiment, an element other than a resistive element can be used as long as the element disconnects between the output terminals OutN and OutP and gates of the transistors M1, M3 and M7 in an AC manner and connects between the output terminals OutN and OutP and the gates of the transistors M1, M3 and M7 in a DC manner. For example, an inductance element may be used.

The transistor M5 constituting a current source is connected between a common source of the transistors M1 and M3 and a reference potential point. The transistor M5 has a drain connected to the common source (point X) of the transistors M1 and M3, a source connected to the reference potential point, and a gate connected to the transistor M6.

In the present embodiment, the transistors M5, M1, and M3 constitute a cascode portion of a cascode current source.

The transistor M7 has a drain connected to the current source 11 and a source connected to a drain of the transistor M6. The transistor M6 has a source connected to a reference potential point and a gate connected to the gate of the transistor M5 and a drain of the transistor M7. The gate of the transistor M7 is connected to a junction of the resistors R3 and R4. Upon application of a same gate voltage to the gates of the transistors M5 and M6, a mirror current based on a current flowing into the current source 11 flows into the transistor M5.

Operation of the inverting amplifier circuit configured in the above-described manner will be described with reference to FIGS. 4 and 5.

Figure 4:
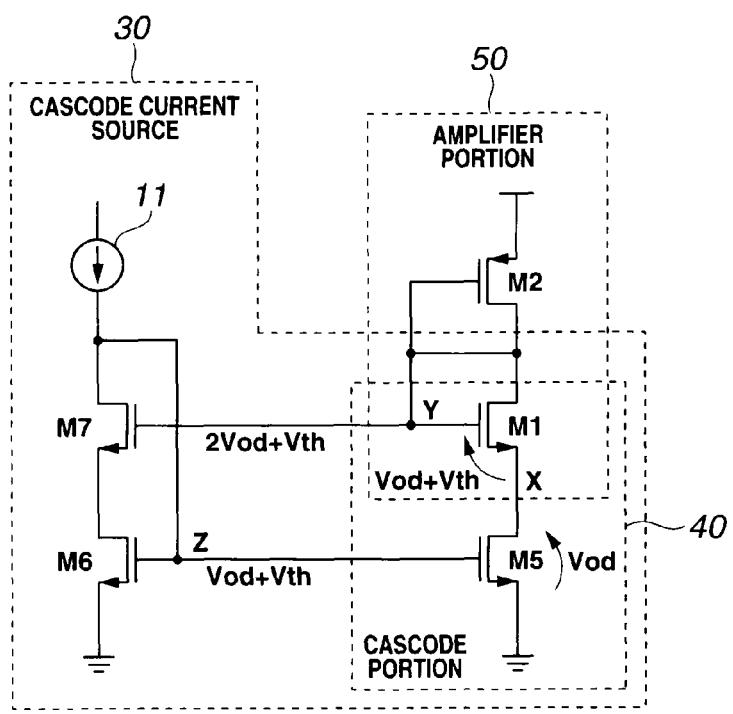
FIG. 4 is a circuit diagram showing a DC configuration of an inverting amplifier 10 in FIG. 1.

FIG. 4 is a circuit diagram showing a DC configuration of the inverting amplifier 10 in FIG. 1. Note that a differential configuration is omitted in FIG. 4. FIG. 5 is a circuit diagram showing a DC configuration of the inverting amplifier 20 in FIGS. 2 and 3. Note that a differential configuration is also omitted in FIG. 5.

Figure 5:
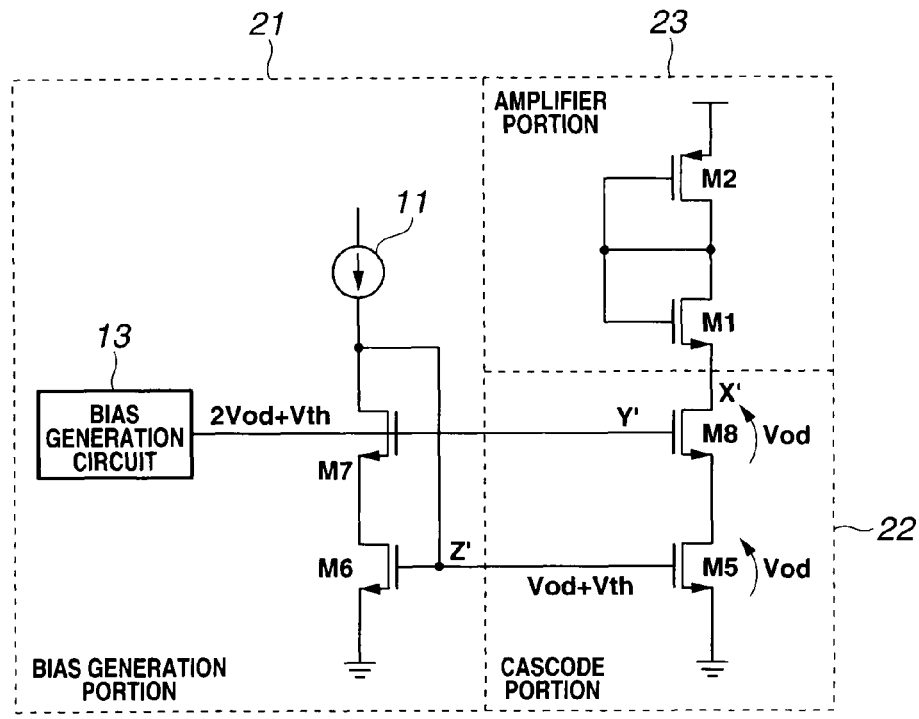
FIG. 5 is a circuit diagram showing a DC configuration of an inverting amplifier 20 in FIGS. 2 and 3.

As shown in FIG. 5, the inverting amplifier 20 is composed of the bias generation portion 21, the cascode portion 22, and an amplifier portion 23. As described above, a bias voltage of Vod+Vth is applied to the gate (point Z') of the transistor M5 of the cascode portion 22. A voltage of 2Vod or more needs to be applied to the drain (point X') of the transistor M8, and a voltage of 2Vod+Vth needs to be applied to a gate (point Y') of the transistor M8. For the reason, a bias voltage of 2Vod+Vth is generated by the bias circuit 13 in the inverting amplifier 20.

As shown in FIG. 4, the inverting amplifier 10 is composed of a cascode current source 30, a cascode portion 40, and an amplifier portion 50. In the present embodiment, the transistor M1 is shared by the cascode portion 40 and amplifier portion 50. That is, the cascode portion 40 is composed of the transistor M5 and the transistor M1 while the amplifier portion 50 is composed of the transistor M1 and the transistor M2.

The cascode current source 30 is composed of the transistors M1 and M5 constituting the cascode portion 40, the transistors M6 and M7, and the current source 11. A current from the current source 11 flowing into the transistors M6 and M7 causes a bias voltage of Vod+Vth to be supplied to a common gate of the transistors M5 and M6. Since an overdrive voltage for the transistor M5 is Vod, the transistor M1 operates upon application of a bias voltage of 2Vod+Vth to the gate. The gate of the transistor M1 is connected to the drain of the transistor M1 and the gates of the transistors M7 and M2, and the gate of the transistor M1 is self-biased. A voltage of 2Vod+Vth is applied to the drain of the transistor M1. There is a voltage equal to or more than the overdrive voltage between the drain and the source of the transistor M1, and the transistor M1 performs in saturated region.

The cascode current source 30 operates when bias voltages are supplied to the transistors M5 and M6 and the transistors M1 and M7, and a mirror current based on a current flowing into the current source 11 flows into the transistors M1 and M5. The transistors M5 and M1, into which a mirror current flows, are cascoded, and the cascode current source 30 has a high output impedance. The cascode current source 30 is excellent in current source characteristics and is capable of applying a stable bias current.

The amplifier portion 50 has a configuration similar to a configuration of the amplifier portion 23 in FIG. 5 and is capable of inversely amplifying an input signal. The point X, which is a source point of the transistor M1, i.e., a minimum potential point of the amplifier portion 50, corresponds to the drain of the transistor M5, and a potential at the point X is the overdrive voltage of Vod. Accordingly, the voltage at the point X is lower than a minimum voltage (2Vod) at the minimum potential point X' of the amplifier portion 23 in FIG. 5. For the reason, even if a power supply voltage is reduced, a sufficient power supply voltage margin and a sufficient input-output voltage range margin are left.

As described above, in the present embodiment, a transistor is used as both a high-potential-side transistor of a cascode current source and a low-potential-side transistor constituting an amplifier portion. The configuration makes it possible to increase an output impedance of the cascode current source without increasing a minimum potential at a minimum potential point of the amplifier portion and improve current source characteristics. Since the high-potential-side transistor of the cascode current source is self-biased, a separate bias circuit is unnecessary. It is possible to reduce a circuit area and to reduce power consumption.

Note that an inverting amplifier with a differential configuration is shown in the above-described first embodiment, it is apparent that the present invention can also be applied to a single-phase amplifier, as shown in FIG. 4.

(Modification)

Figure 6:
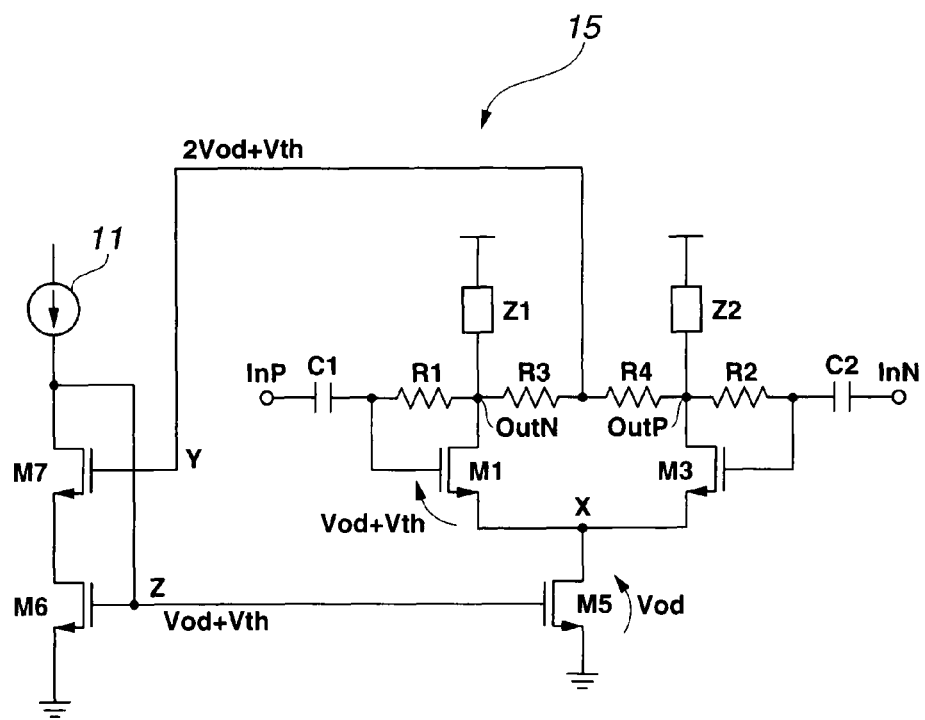
FIG. 6 is a circuit diagram showing a modification of the first embodiment.

FIG. 6 is a circuit diagram showing a modification of the first embodiment. Same components in FIG. 6 as in FIG. 1 are denoted by same reference numerals, and a description of the components will be omitted.

An inverting amplifier 15 according to the present modification is different from the inverting amplifier 10 in FIG. 1 in that load circuits Z1 and Z2 are adopted instead of the transistors M2 and M4. The transistor M1 and the load circuit Z1 constitute an inverting amplifier. Furthermore, the transistor M3 and the load circuit Z2 constitute an inverting amplifier. That is, the circuit in FIG. 6 has same working effects as in FIG. 1.

Second Embodiment

Figure 7:
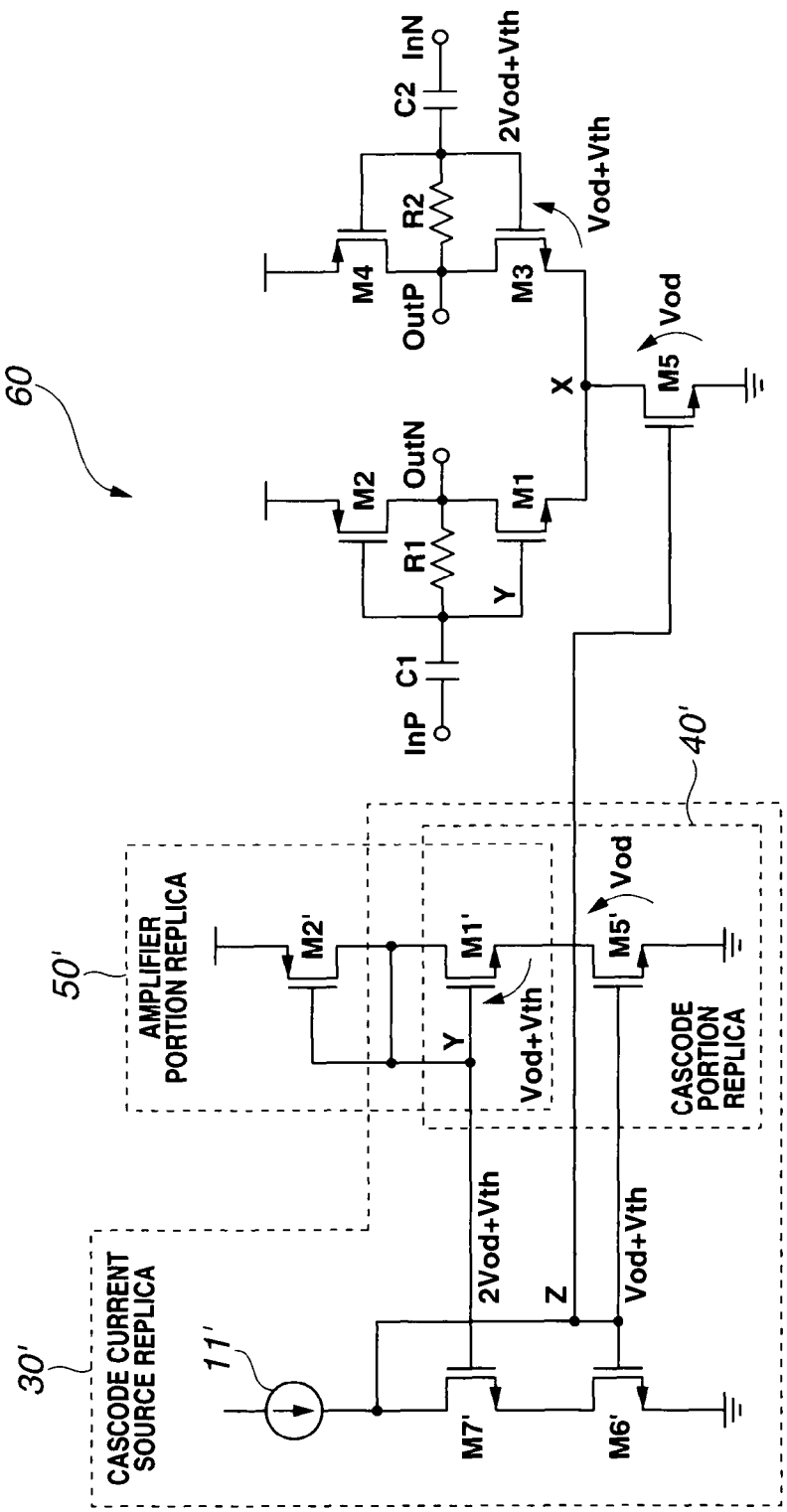
FIG. 7 is a circuit diagram showing a second embodiment of the present invention.

FIG. 7 is a circuit diagram showing a second embodiment of the present invention. Same components in FIG. 7 as in FIGS. 1 and 2 are denoted by same reference numerals, and a description of the components will be omitted.

In the first embodiment, the resistors R3 and R4 are provided between the output terminals OutN and OutP and the gate of the transistor M7 to connect between the output terminals OutN and OutP and the gate of the transistor and M7 in a DC manner, as shown in FIG. 1. However, since a parasitic capacitance (not shown) is produced for each of the resistors R3 and R4, characteristics of the inverting amplifier may deteriorate.

For the reason, in the present embodiment, a replica circuit configured to determine a DC characteristic of an inverting amplifier is provided. The configuration makes it possible to omit the resistors R3 and R4 and prevent deterioration of characteristics. An inverting amplifier 60 shown in FIG. 7 adopts a cascode current source replica 30', an amplifier portion replica 50', and a transistor M5 instead of the current source 12 of the inverting amplifier 20 in FIG. 2.

Transistors M1', M2', and M5' to M7' and a current source 11' have same characteristics as the transistors M1, M2, and M5 to M7, and the current source 11 in FIG. 1. The cascode current source replica 30', a cascode portion replica 40', and the amplifier portion replica 50' have same configurations as the cascode current source 30, cascode portion 40, and amplifier portion 50, respectively, in FIG. 4. That is, the replicas 30' to 50' in FIG. 7 have a same configuration as the DC configuration of the first embodiment shown in FIG. 4.

A gate of the transistor M5 is commonly connected to gates of the transistors M5' and M6' of the cascode current source replica 30'. With the configuration, a mirror current corresponding to a mirror current flowing into the transistor M5' of the cascode current source replica 30' flows into the transistor M5. The transistor M5 and transistors M1 and M3 constitute a cascode portion of a cascode current source. A bias voltage applied to gates of the transistors M1 and M3 is equal to a voltage applied to a gate of the transistor M1' of the cascode portion replica 40'.

As described above, in the present embodiment, the inverting amplifier 60 operates in a same manner as in the first embodiment in DC terms. In AC terms, the inverting amplifier 60 inversely amplifies a signal inputted to input terminals InP and InN. Since output terminals OutN and OutP are not connected to the resistors R3 and R4, output characteristics better than the first embodiment are obtained.

(Modification)

Figure 8:
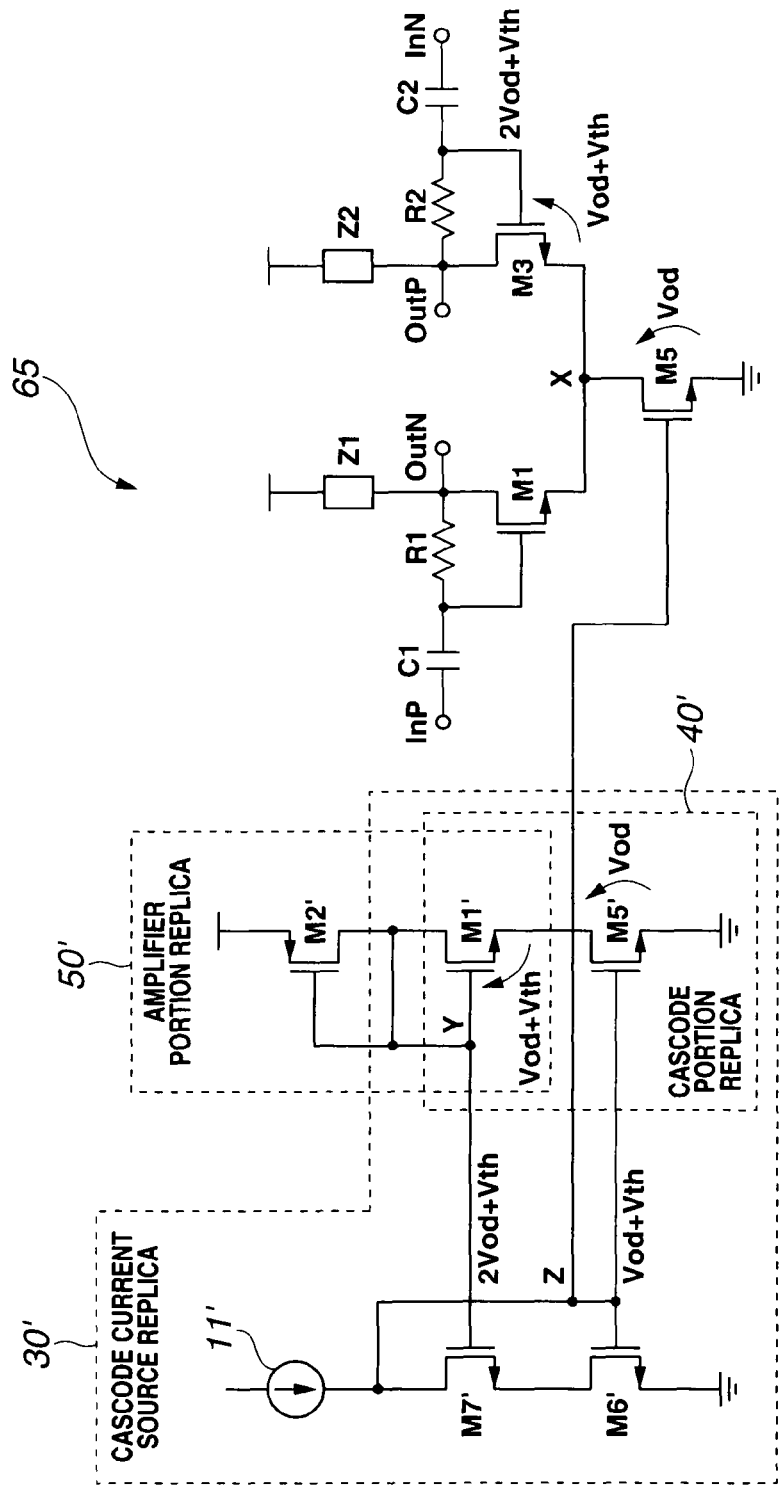
FIG. 8 is a circuit diagram showing a modification of the second embodiment.

FIG. 8 is a circuit diagram showing a modification of the second embodiment. Same components in FIG. 8 as in FIG. 7 are denoted by same reference numerals, and a description of the components will be omitted.

An inverting amplifier 65 according to the present modification is different from the inverting amplifier 60 in FIG. 7 in that load circuits Z1 and Z2 are adopted instead of the transistors M2 and M4. The transistor M1 and the load circuit Z1 constitute an inverting amplifier. Furthermore, the transistor M3 and the load circuit Z2 constitute an inverting amplifier. That is, the circuit in FIG. 8 has same working effects as in FIG. 7.

Note that although examples in which a current source is composed of NMOS transistors have been described in the above-described embodiments, it is apparent that a current source may be composed of PMOS transistors.

Having described the preferred embodiments of the invention referring to the accompanying drawings, it should understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device comprising:
an amplification portion including a first transistor configured to inversely amplify an input signal inputted to a gate and output the inversely amplified input signal from a drain;
a cascode current source including the first transistor, a second transistor having a drain connected to a source of the first transistor and a source connected to a reference potential point to supply a bias current to the first transistor, a third transistor having a gate to which only a DC component out of an AC component and the DC component included in a voltage applied to the gate of the first transistor is applied, a fourth transistor having a gate connected to a gate of the second transistor, and a current source, and configured to control the bias current based on a current flowing into the current source; and
a first element portion configured to block an AC signal and pass through a DC signal between the drain of the first transistor and the gates of the first and third transistors.

2. The semiconductor integrated circuit device according to claim 1, wherein
in the cascode current source,
the third transistor has a drain connected to the current source and the gate of the fourth transistor and a source connected to a drain of the fourth transistor,
a source of the fourth transistor is connected to a reference potential point, and
a mirror current flowing into the current source is applied to a drain-to-source path of the second transistor.

3. The semiconductor integrated circuit device according to claim 1, further comprising:
a load circuit connected between a power supply terminal and the drain of the first transistor.

4. The semiconductor integrated circuit device according to claim 1, further comprising:
a fifth transistor having a gate to which the input signal is inputted, a source connected to a power supply terminal, and a drain connected to the drain of the first transistor.

5. The semiconductor integrated circuit device according to claim 1, further comprising:
a sixth transistor having a source commonly connected to the source of the first transistor, the sixth transistor and the first transistor constituting a differential pair; and
a second element portion configured to block an AC signal and pass through a DC signal between a drain of the sixth transistor and gates of the sixth and third transistors.

6. The semiconductor integrated circuit device according to claim 5, further comprising:
a fifth transistor having a gate to which the input signal is inputted, a source connected to a power supply terminal, and a drain connected to the drain of the first transistor; and
a seventh transistor having a gate to which an inverted signal of the input signal is inputted, a source connected to a power supply terminal, and a drain connected to the drain of the sixth transistor.

7. The semiconductor integrated circuit device according to claim 1, wherein
the first element portion comprises
a first resistive element configured to block an AC signal and pass through a DC signal between the drain of the first transistor and the gate of the third transistor, and
a second resistive element configured to block an AC signal and pass through a DC signal between the drain and the gate of the first transistor.

8. The semiconductor integrated circuit device according to claim 5, wherein
the first element portion comprises
a first resistive element configured to block an AC signal and pass through a DC signal between the drain of the first transistor and the gate of the third transistor, and
a second resistive element configured to block an AC signal and pass through a DC signal between the drain and the gate of the first transistor, and
the second element portion comprises
a third resistive element configured to block an AC signal and pass through a DC signal between the drain of the sixth transistor and the gate of the third transistor, and
a fourth resistive element configured to block an AC signal and pass through a DC signal between the drain and the gate of the sixth transistor.

9. A semiconductor integrated circuit device comprising:
an amplification portion having a first transistor configured to inversely amplify an input signal inputted to a gate and output the inversely amplified input signal from a drain;

a second transistor having a drain connected to a source of the first transistor and a source connected to a reference potential point to supply a bias current to the first transistor;

a cascode current source composed of an eighth transistor and a ninth transistor which have same characteristics as the first and second transistors, respectively, a 10th transistor having a gate connected to a gate of the eighth transistor, an 11th transistor having a gate connected to a gate of the ninth transistor, and a current source, and configured to control the bias current based on a current flowing into the current source; and a first element portion configured to block an AC signal and pass through a DC signal between the drain and the gate of the first transistor.

10. The semiconductor integrated circuit device according to claim 9, wherein in the cascode current source, the 10th transistor has a drain connected to the current source and the gate of the 11th transistor and a source is connected to a drain of the 11th transistor, a source of the 11th transistor is connected to a reference potential point, and a mirror current flowing into the current source is applied to a drain-to-source path of the second transistor.

11. The semiconductor integrated circuit device according to claim 9, further comprising:

a load circuit connected between a power supply terminal and the drain of the first transistor.

12. The semiconductor integrated circuit device according to claim 9, further comprising:

a fifth transistor having a gate to which the input signal is inputted, a source connected to a power supply terminal, and a drain connected to the drain of the first transistor.

13. The semiconductor integrated circuit device according to claim 9, further comprising:

a sixth transistor having a source commonly connected to the source of the first transistor, the sixth transistor and the first transistor constituting a differential pair; and a second element portion configured to block an AC signal and pass through a DC signal between a drain and a gate of the sixth transistor.

14. The semiconductor integrated circuit device according to claim 13, further comprising:

a fifth transistor having a gate to which the input signal is inputted, a source connected to a power supply terminal, and a drain connected to the drain of the first transistor; and a seventh transistor having a gate to which an inverted signal of the input signal is inputted, a source connected to a power supply terminal, and a drain connected to the drain of the sixth transistor.

15. The semiconductor integrated circuit device according to claim 9, wherein the first element portion is composed of a resistive element.

16. The semiconductor integrated circuit device according to claim 13, wherein the first and second element portions are each composed of a resistive element.

* * * * *